(12) United States Patent
Ishido et al.

(10) Patent No.: US 12,237,273 B2
(45) Date of Patent: Feb. 25, 2025

(54) MODULE

(71) Applicant: Murata Manufacturing Co., Ltd., Nagaokakyo (JP)

(72) Inventors: Mitsuo Ishido, Nagaokakyo (JP); Motohiko Kusunoki, Nagaokakyo (JP); Minoru Komiyama, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 230 days.

(21) Appl. No.: 17/659,389

(22) Filed: Apr. 15, 2022

(65) Prior Publication Data
US 2022/0238455 A1    Jul. 28, 2022

Related U.S. Application Data

(63) Continuation of application No. PCT/JP2020/039690, filed on Oct. 22, 2020.

(30) Foreign Application Priority Data

Nov. 7, 2019   (JP) .................................. 2019-202480

(51) Int. Cl.
*H01L 23/552* (2006.01)
*H01L 23/498* (2006.01)
*H01L 25/16* (2023.01)

(52) U.S. Cl.
CPC ...... *H01L 23/552* (2013.01); *H01L 23/49811* (2013.01); *H01L 25/16* (2013.01)

(58) Field of Classification Search
CPC ... H01L 23/552; H01L 23/49811; H01L 25/16
See application file for complete search history.

(56) References Cited

U.S. PATENT DOCUMENTS

| | | | |
|---|---|---|---|
| 10,937,741 B2* | 3/2021 | Yang | H01L 21/568 |
| 2010/0276792 A1* | 11/2010 | Chi | H01L 23/3128 |
| | | | 257/E23.116 |

(Continued)

FOREIGN PATENT DOCUMENTS

| | | |
|---|---|---|
| WO | 2010/041356 A1 | 4/2010 |
| WO | 2011/111318 A1 | 9/2011 |

(Continued)

OTHER PUBLICATIONS

WO 2018101384 A1 English translation (Year: 2018).*
International Search Report for PCT/JP2020/039690 dated Dec. 28, 2020.

*Primary Examiner* — Mukundbhai G Patel
(74) *Attorney, Agent, or Firm* — MCDONALD HOPKINS LLC

(57) ABSTRACT

A module includes a substrate having a first surface, a first component and a second component that are mounted on the first surface, a first conductive material mounted between the first component and the second component, a first sealing resin provided on the first surface to cover the first component, the second component, and the first conductive material, and a first shield film that covers the first sealing resin, in which the first sealing resin has a recess to expose at least a part of the first conductive material, the first shield film extends along an inner surface of the recess and is, thereby, electrically connected to the first conductive material, the first shield film is provided with an opening in the recess, a metal bump is disposed inside the recess, and the metal bump is electrically connected to the first conductive material through the opening.

20 Claims, 7 Drawing Sheets

(56) References Cited

U.S. PATENT DOCUMENTS

| | | | |
|---|---|---|---|
| 2012/0320559 A1 | 12/2012 | Kimura | |
| 2016/0064315 A1* | 3/2016 | Wu | H01L 21/4853 361/783 |
| 2018/0076148 A1* | 3/2018 | Nguyen | H01L 23/49811 |
| 2019/0273312 A1 | 9/2019 | Otsubo | |
| 2020/0118913 A1 | 4/2020 | Matsukawa et al. | |
| 2020/0137893 A1 | 4/2020 | Nomura et al. | |

FOREIGN PATENT DOCUMENTS

| | | | | |
|---|---|---|---|---|
| WO | WO-2018101384 A1 * | 6/2018 | | H01L 23/00 |
| WO | 2018/235715 A1 | 12/2018 | | |
| WO | 2019/004332 A1 | 1/2019 | | |

* cited by examiner

MODULE

CROSS REFERENCE TO RELATED APPLICATION

This is a continuation of International Application No. PCT/JP2020/039690 filed on Oct. 22, 2020 which claims priority from Japanese Patent Application No. 2019-202480 filed on Nov. 7, 2019. The contents of these applications are incorporated herein by reference in their entireties.

BACKGROUND OF THE DISCLOSURE

Field of the Disclosure

The present disclosure relates to a module.

Description of the Related Art

International Patent Publication No. 2018/101384 (PTL 1) discloses a high frequency module having a configuration in which a plurality of components is mounted on an upper surface and a lower surface of a wiring substrate. In this high frequency module, a first sealing resin layer is provided to cover the upper surface of the wiring substrate, and a second sealing resin layer is provided to cover the lower surface the wiring substrate. A shield film is provided to cover a side surface of the second sealing resin layer, a side surface of the wiring substrate, and a side surface and an upper surface of the first sealing resin layer. Further, a shield electrode is disposed to cover a part of a lower surface of the second sealing resin layer. A shield wall is formed to surround one of the plurality of components mounted on the lower surface of the wiring substrate, and a lower end of the shield wall is connected to the shield electrode.

PTL 1: International Patent Publication No. 2018/101384

BRIEF SUMMARY OF THE DISCLOSURE

In the high frequency module disclosed in PTL 1, ground connection to the film-shaped shield electrode disposed to cover a part of the lower surface of the second sealing resin layer is performed from the wiring substrate through the shield wall. A conductive paste is used as a material of the shield wall and, in this case, a resistance value in a ground connection path increases. Thus, there is a possibility that a sufficient ground potential is not obtained.

In addition, considering that the module is mounted on a mother substrate or the like, it is preferable that ground connection can be performed from a counterpart ground terminal to be mounted, but it is difficult to perform ground connection with a shield film having a film shape.

Therefore, an object of the present disclosure is to provide a module that allows ground connection to be sufficiently performed.

In order to achieve the above object, a module of the present disclosure includes a substrate having a first surface, a first component and a second component that are mounted on the first surface, a first conductive material mounted between the first component and the second component on the first surface, a first sealing resin provided on the first surface to cover the first component, the second component, and the first conductive material, and a first shield film that covers a surface, of the first sealing resin, farther from the substrate. The first sealing resin has a recess to expose at least a part of the first conductive material. The first shield film extends along an inner surface of the recess and is, thereby, electrically connected to the first conductive material. Furthermore, the first shield film is provided with an opening in the recess. A metal bump is disposed inside the recess. The metal bump is electrically connected to the first conductive material through the opening.

In the present disclosure, the metal bump is disposed inside the recess provided in the first sealing resin, and when the module is mounted on a mother substrate or the like, the metal bump can secure electrical connection. Therefore, the ground connection of the module can be sufficiently performed.

DETAILED DESCRIPTION OF THE DISCLOSURE

Figure 1:
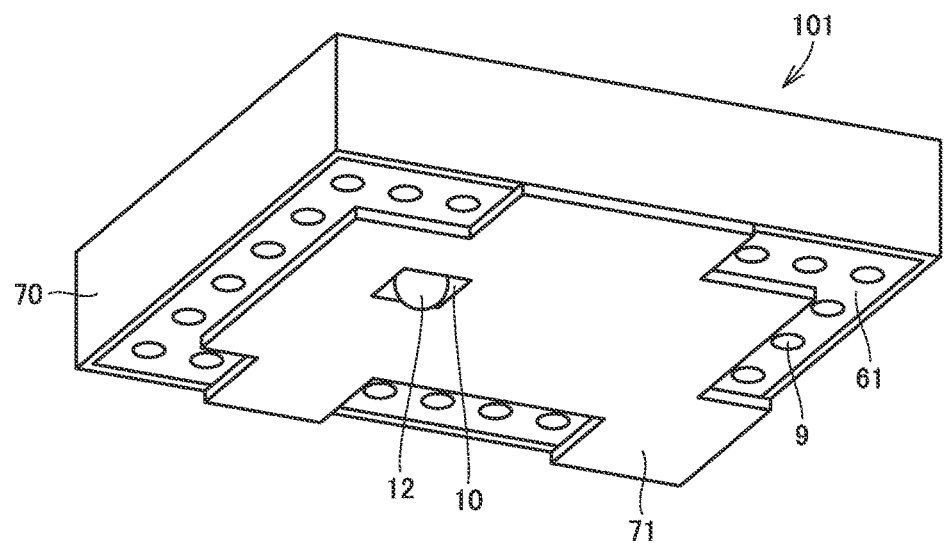
FIG. 1 is a perspective view of a module according to a first embodiment of the present disclosure.

The dimensional ratios illustrated in the drawings do not necessarily represent the actual dimensional ratios, and the dimensional ratios may be exaggerated for convenience of description. In the following description, when referring to a generic or specific concept, it does not necessarily mean absolutely generic or specific, but may mean relatively generic or specific in the illustrated posture.

First Embodiment

Figure 2:
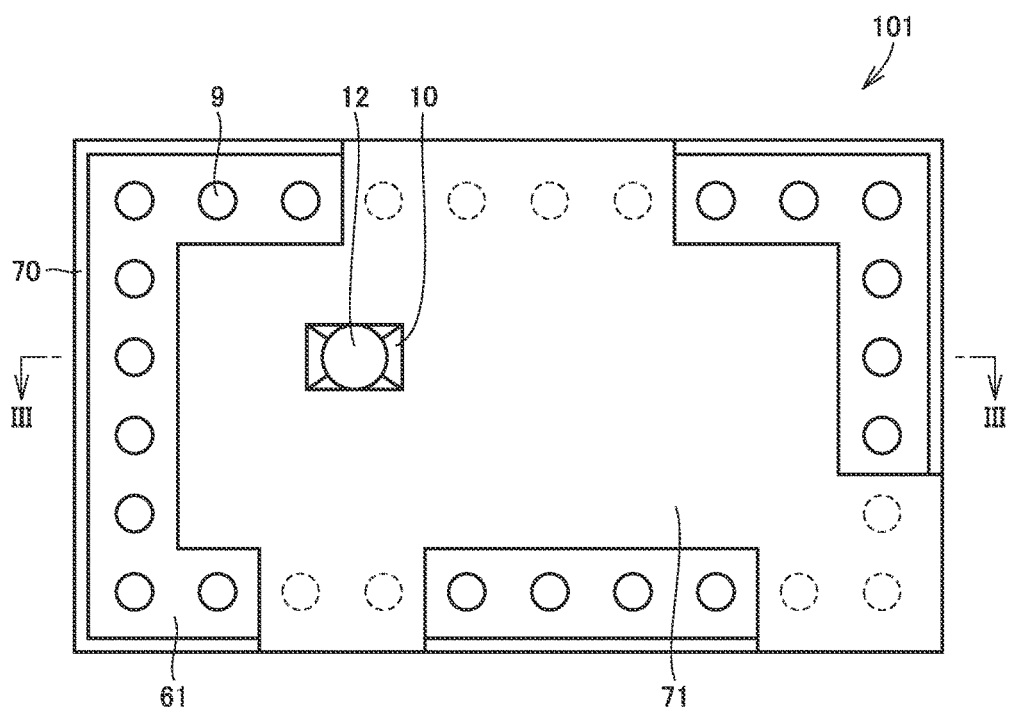
FIG. 2 is a bottom view of the module according to the first embodiment of the present disclosure.
Figure 3:
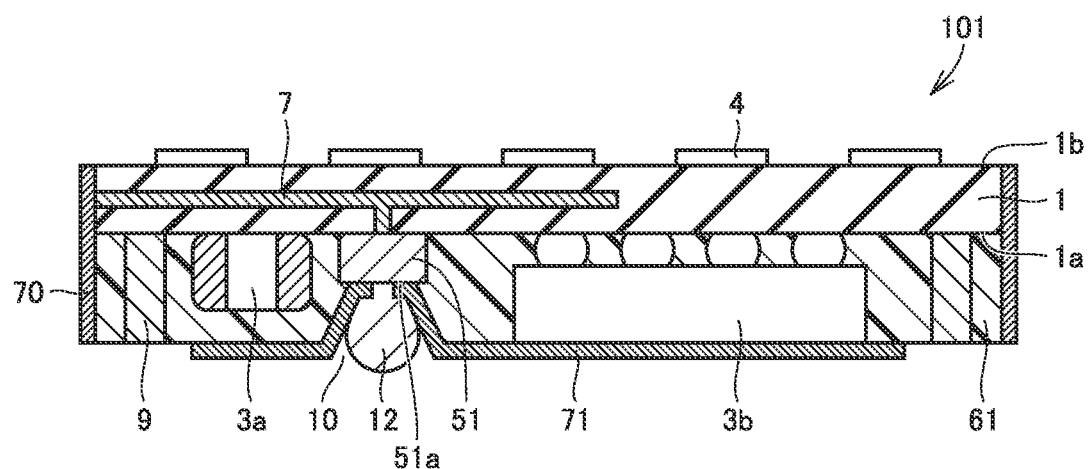
FIG. 3 is a sectional view taken along line III-III in FIG. 2 as viewed in a direction of arrows.

With reference to FIGS. 1 to 4, a module according to a first embodiment of the present disclosure will be described. FIG. 1 illustrates a module 101 according to the present embodiment as viewed obliquely from below. Module 101 has a substantially rectangular parallelepiped shape as a whole. Module 101 includes a shield film 70 formed to cover a side surface. Module 101 includes a first shield film 71 formed to cover a part of a lower surface. FIG. 2 illustrates a bottom view of module 101. A first sealing resin 61 is exposed at a part of the lower surface not covered with first shield film 71. A plurality of connection terminals 9 are provided at a part where first sealing resin 61 is exposed. The plurality of connection terminals 9 are aligned near an outer edge of the lower surface of module 101. Shield film 70 may have a multilayer structure. First shield film 71 may also have a multilayer structure. For example, first shield film 71 may be formed by an adhesion layer formed on a surface of first sealing resin 61 or the like, a conductive layer laminated on the adhesion layer, and a protective layer laminated on the conductive layer. The adhesion layer is provided to increase a degree of adhesion between the conductive layer and first sealing resin 61, and can be formed of, for example, a metal such as Ti, Cr, or SUS. The conductive layer is a layer having a substantial shielding function of first shield film 71, and can be formed of, for example, a metal such as Cu, Ag, or Al. The protective layer is provided to prevent corrosion or the like of the conductive layer, and can be formed of, for example, a metal such as Ti, Cr, or SUS. FIG. 3 is a sectional view taken along line III-III in FIG. 2 as viewed in line III-III.

Module 101 includes a substrate 1 having a first surface 1a, a component 3a as a first component and a component 3b as a second component mounted on first surface 1a, a first conductive material 51 mounted between the first component and the second component on the first surface 1a, first sealing resin 61 provided on the first surface to cover the first component, the second component, and the first conductive material, and first shield film 71 that covers a surface, of first sealing resin 61, farther from substrate 1. A ground conductor pattern 7 is disposed inside substrate 1. First conductive material 51 is electrically connected to ground conductor pattern 7. Further, first conductive material 51 has a first joint surface 51a having higher solder wettability than first shield film 71, on the surface farther from substrate 1. First sealing resin 61 has a recess 10 to expose at least a part of first conductive material 51. An inner surface of recess 10 is tapered. In recess 10, an opening 13 is provided in first shield film 71. An antenna electrode 4 is disposed on first surface 1a. Antenna electrode 4 may be an aggregate of a plurality of separated electrodes, or may be a connected and integrated electrode. A position, shape, size, and arrangement of antenna electrode 4 illustrated in FIG. 3 are merely examples, and are not limited to those illustrated here.

Figure 4:
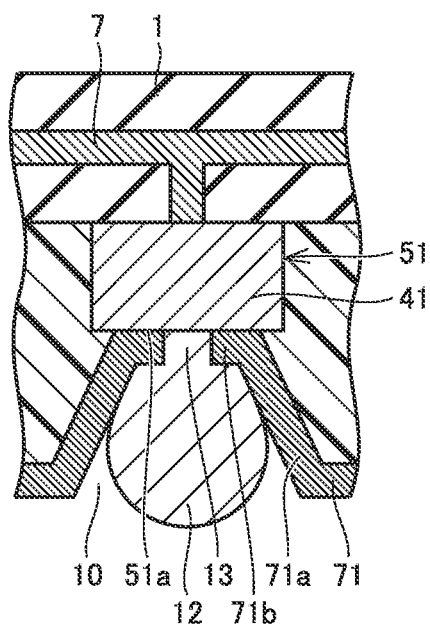
FIG. 4 is a partially enlarged sectional view of a vicinity of a first conductive material of the module according to the first embodiment of the present disclosure.

FIG. 4 is an enlarged view of a vicinity of first conductive material 51. In FIG. 4, antenna electrode 4 is not illustrated. First shield film 71 is electrically connected to first conductive material 51 by extending along the inner surface of recess 10. A metal bump is disposed inside recess 10. The metal bump is electrically connected to first conductive material 51 through opening 13. In the example shown here, the metal bump is a solder bump 12. That is, solder bump 12 is disposed inside recess 10. Solder bump 12 is electrically connected to first joint surface 51a. Solder bump 12 protrudes from the surface, of first sealing resin 61, farther from substrate 1. First shield film 71 includes a part 71a covering a slope of recess 10 and a part 71b covering a bottom surface of recess 10. Part 71b is provided with an opening 13. Solder bump 12 is electrically connected to first joint surface 51a through opening 13. Opening 13 can be formed, for example, by performing laser processing on first shield film 71. Here, in a case where the shield film has a multilayer structure, it is desirable that the protective layer of first shield film 71 has low solder wettability. As a result, in part 71a covering the slope of recess 10 of first shield film 71, solder bump 12 does not wet or spread over, a bump shape is maintained, and electrical connection with a mother substrate can be reliably achieved.

In the present embodiment, solder bump 12 is disposed inside recess 10 provided in first sealing resin 61, and opening 13 provided in the shield film secures electric connection between the solder bump and first conductive material 51 constituting an inter-component shield. Thus, when module 101 is mounted on a mother substrate or the like, solder bump 12 can secure electrical connection. Therefore, ground connection can be sufficiently performed to the shield film (first shield film 71 corresponds to the "shield film" herein) formed to cover the lower surface of module 101.

In a configuration in which a shield wall is formed to have a shielding function as in the related art, a groove serving as the shield wall is formed using a laser at a time of forming the shield wall. However, there is also a problem that the substrate is damaged by a laser light. In the present embodiment, the conductive material is used instead of the shield wall, and it is thus not necessary to process the substrate using a laser. Therefore, the substrate is not damaged.

As illustrated in the present embodiment, the first conductive material has the first joint surface having higher solder wettability than the first shield film on the surface farther from the substrate, and the metal bump is preferably a solder bump. The configuration adopted herein can achieve electrical connection with the mother substrate more reliably.

First conductive material 51 preferably includes a first metal block 41. In the example illustrated in FIG. 4, first conductive material 51 as a whole is first metal block 41. The configuration adopted herein can achieve first conductive material 51 with a simple configuration. First metal block 41 is preferably a copper block. The configuration adopted herein can suppress electric resistance of first conductive material 51 to be low. First metal block 41 may be a block formed of a metal other than copper.

Figure 5:
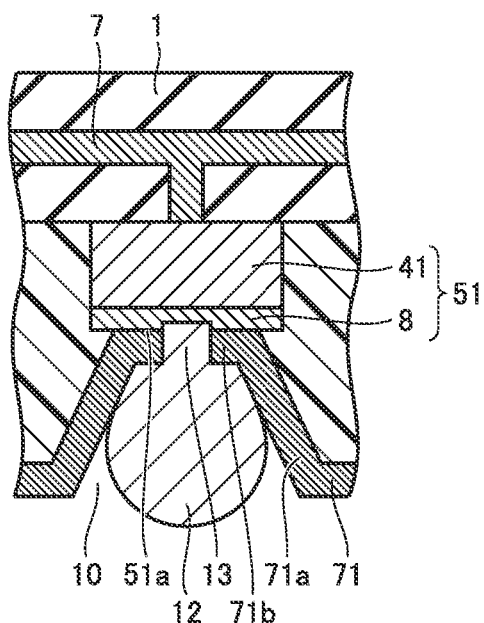
FIG. 5 is a partially enlarged sectional view of a vicinity of a first conductive material of a modification of the module according to the first embodiment of the present disclosure.

Instead of the configuration illustrated in FIG. 4, a solder wet layer 8 may be provided as illustrated in FIG. 5. In the example shown in FIG. 5, first conductive material 51 includes first metal block 41 and solder wet layer 8. First conductive material 51 includes first metal block 41, and preferably includes solder wet layer 8 having higher solder wettability than a material of first metal block 41, so that first conductive material 51 is exposed as first joint surface 51a. The configuration adopted herein can increase a degree of freedom in selecting the material of first metal block 41. Solder wet layer 8 may be, for example, Au/Ni plating. When first metal block 41 is, for example, a copper block, solder wet layer 8 can be formed by applying Ni plating to an upper surface of the copper block and further applying Au plating to the upper surface.

As described in the present embodiment, first surface 1a is preferably a mounting surface of module 101. The configuration adopted herein can reliably ensure the electrical connection at a time of mounting the module by the metal bump disposed inside the recess.

Second Embodiment

Figure 6:
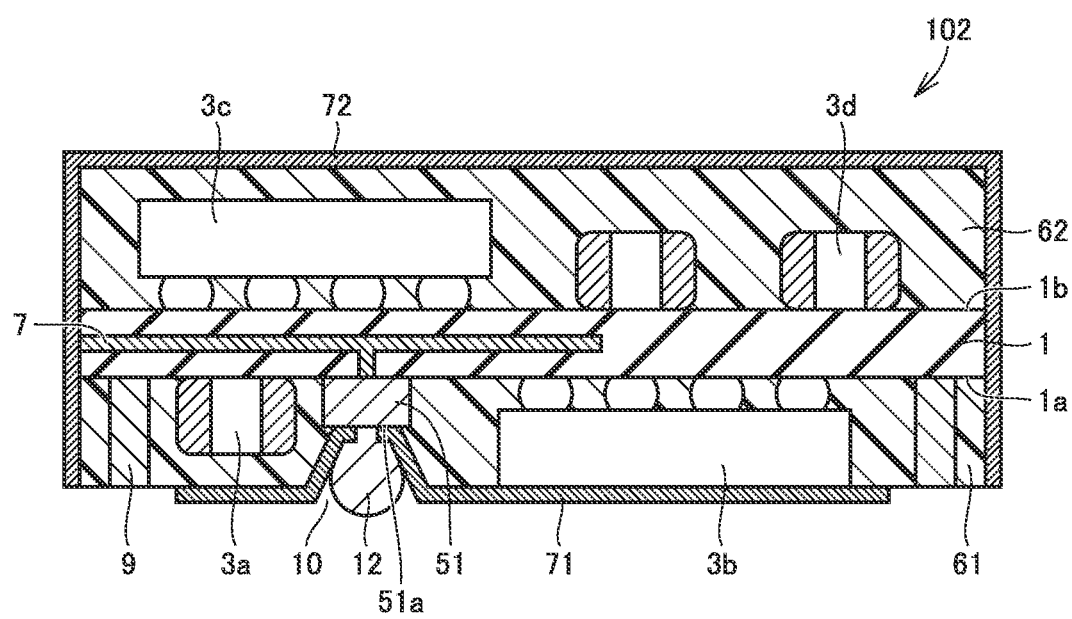
FIG. 6 is a sectional view of a module according to a second embodiment of the present disclosure.

With reference to FIG. 6, a module according to a second embodiment of the present disclosure will be described. FIG. 6 is a sectional view of a module 102 according to the present embodiment. Module 102 has a so-called double-sided mounting structure. In module 102, substrate 1 has a second surface 1b as a surface opposite to first surface 1a. Electronic components 3c and 3d are mounted on second surface 1b. Second surface 1b and the electronic components are covered with a second sealing resin 62. The structure on first surface 1a of substrate 1 of module 102 is similar to that of module 101 described in the first embodiment.

In the present embodiment, since solder bump 12 is disposed inside recess 10 provided in first sealing resin 61, such an effect as described in the first embodiment can be obtained. Furthermore, in the present embodiment, the double-sided mounting structure allows more components to be mounted on one substrate 1.

Third Embodiment

Figure 7:
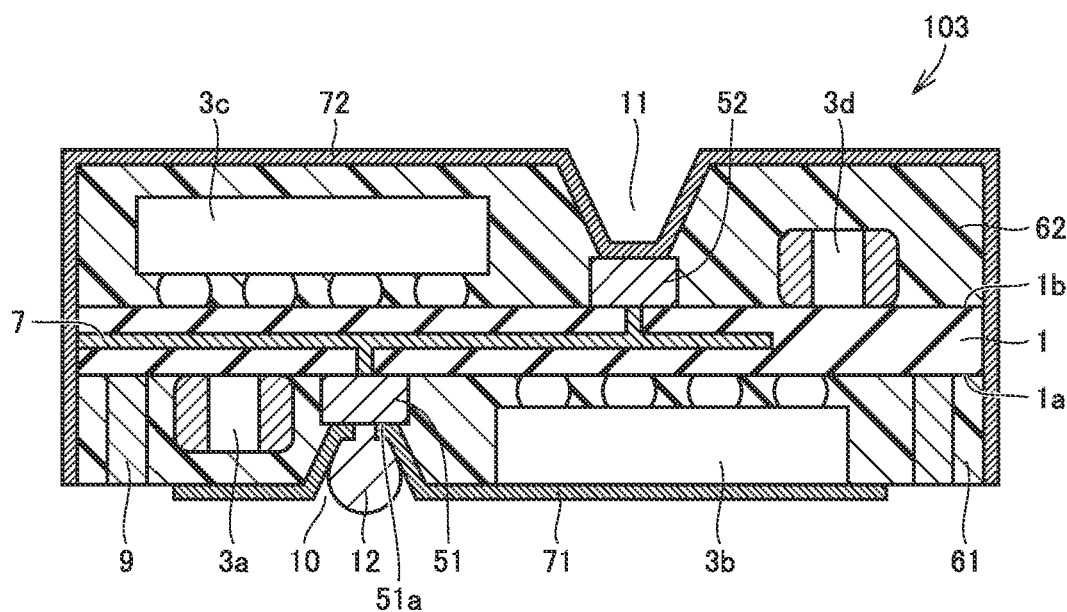
FIG. 7 is a sectional view of a module according to a third embodiment of the present disclosure.

With reference to FIG. 7, a module according to a third embodiment of the present disclosure will be described. FIG. 7 is a sectional view of a module 103 according to the present embodiment.

In module 103, second conductive material 52 is mounted on second surface 1b. Second sealing resin 62 has a thickness more than a height of second conductive material 52. A surface, of second sealing resin 62, farther from substrate 1 is covered with second shield film 72. Second conductive material 52 is disposed between the plurality of electronic components 3c and 3d mounted on second surface 1b. Second conductive material 52 includes a second metal block. The second metal block is, for example, a copper block. Second sealing resin 62 has a recess 11 at a position corresponding to second conductive material 52. Second shield film 72 extends along an inner surface of recess 11. Second shield film 72 is electrically connected to second conductive material 52 at a bottom of recess 11.

In the present embodiment, such an effect as described in the second embodiment can be obtained. Furthermore, in the present embodiment, since second conductive material 52 is mounted on second surface 1b of substrate 1 to achieve a compartment shield, the components mounted on second surface 1b can be operated more reliably.

Fourth Embodiment

Figure 8:
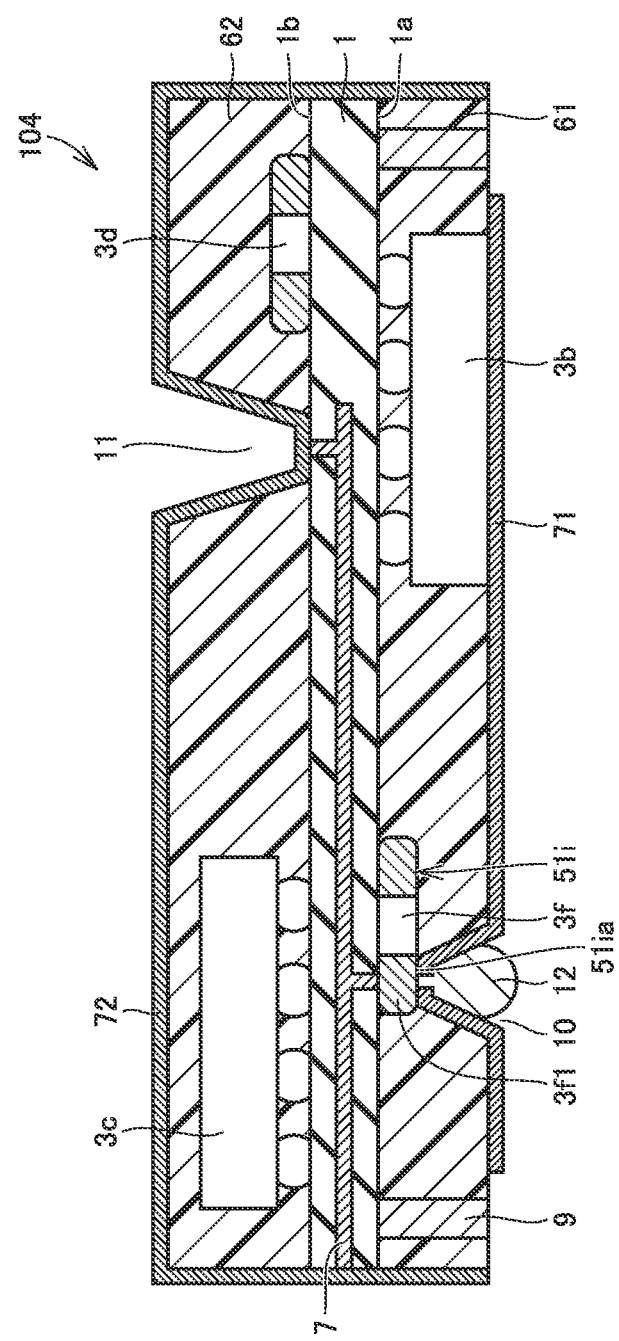
FIG. 8 is a sectional view of a module according to a fourth embodiment of the present disclosure.
Figure 9:
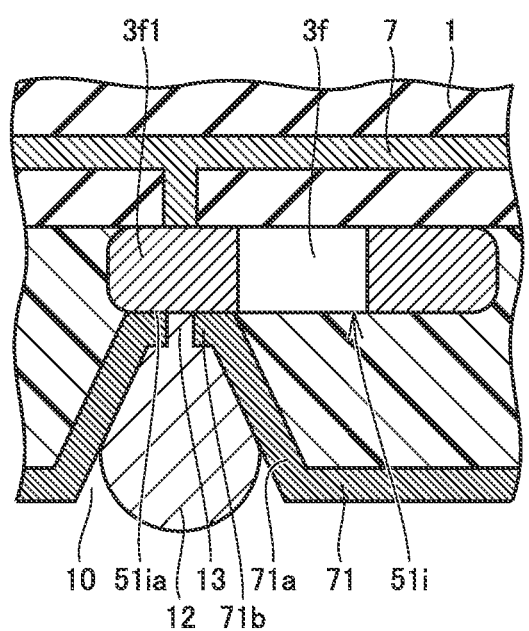
FIG. 9 is a partially enlarged sectional view of a vicinity of a first conductive material of the module according to the fourth embodiment of the present disclosure.

With reference to FIGS. 8 and 9, a module according to a fourth embodiment of the present disclosure will be described. FIG. 8 is a sectional view of a module 104 according to the present embodiment.

In module 104, a first conductive material 51i is mounted on first surface 1a of substrate 1. First conductive material 51i is electrically connected to ground conductor pattern 7. First conductive material 51i is an electronic component 3f including a ground terminal 3f1. FIG. 9 is an enlarged view of a vicinity of first conductive material 51i. First conductive material 51i has a first joint surface 51ia. First joint surface 51ia is a part of ground terminal 3f1. Ground terminal 3f1 is preferably disposed across a surface of electronic component 3f facing substrate 1 and a surface facing an opposite side of substrate 1.

In the present embodiment, electronic component 3f as one of the mounted components is used as first conductive material 51i. In the present embodiment, since it is not necessary to mount a new metal block or the like, space on a surface of substrate 1 can be saved.

Fifth Embodiment

Figure 10:
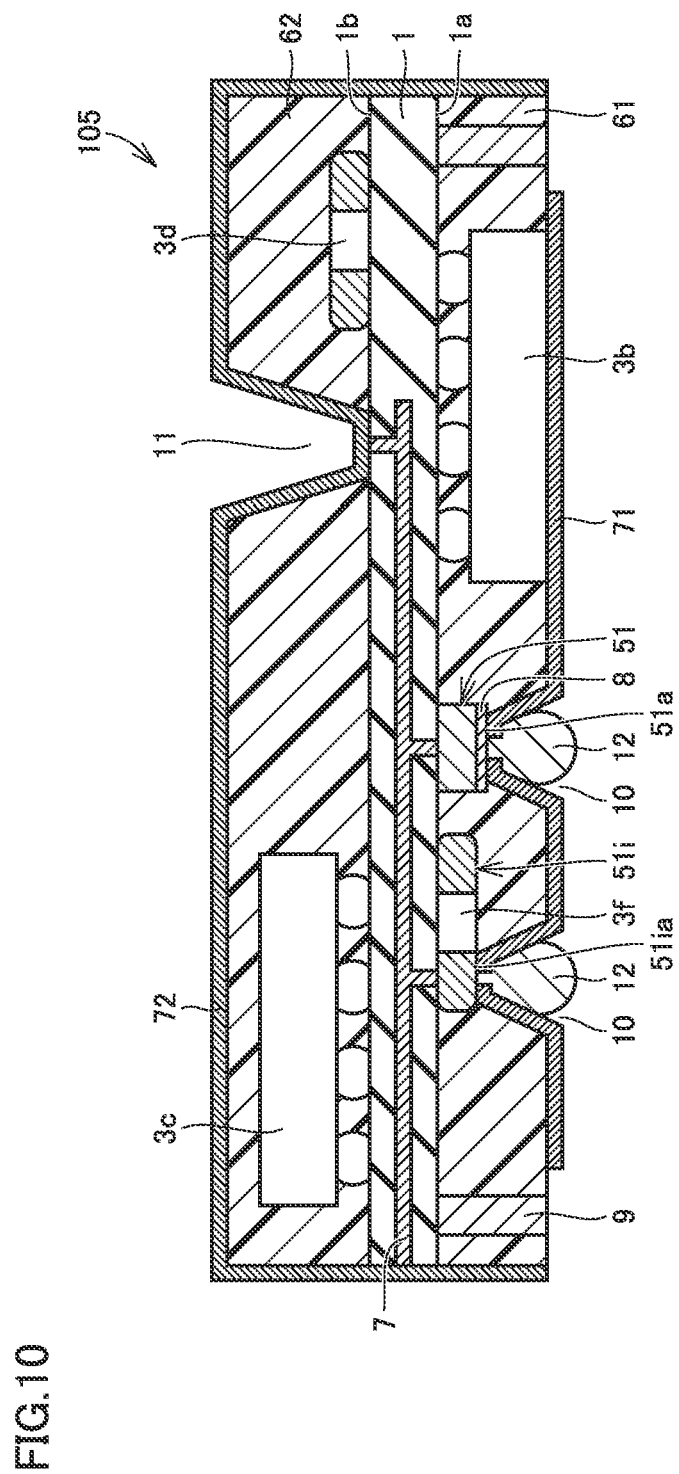
FIG. 10 is a sectional view of a module according to a fifth embodiment of the present disclosure.

With reference to FIG. 10, a module according to a fifth embodiment of the present disclosure will be described. FIG. 10 is a sectional view of a module 105 according to the present embodiment. In module 105, first conductive material 51 and first conductive material 51i are both mounted on first surface 1a of substrate 1. First conductive material 51 has first joint surface 51a. First conductive material 51 includes solder wet layer 8. First joint surface 51a is a surface of solder wet layer 8. First conductive material 51i has a first joint surface 51ia.

Recesses 10 are formed separately and respectively corresponding to first conductive material 51 and first conductive material 51i. Solder bump 12 is disposed inside each of recesses 10. That is, one solder bump 12 is electrically connected to first conductive material 51, and another solder bump 12 is electrically connected to first conductive material 51i.

A ground conductor pattern 7 is disposed inside substrate 1. Ground conductor pattern 7 and first conductor material 51 are electrically connected at first joint surface 51a. Ground conductor pattern 7 and first conductor material 51i are electrically connected at first joint surface 51ia. Ground conductor pattern 7 and second shield film 72 are electrically connected to each other at the bottom of recess 11.

In the present embodiment, when module 105 is mounted on a mother substrate or the like, solder bump 12 secures electrical connection at a plurality of locations. Therefore, ground connection can be sufficiently performed to the shield film formed to cover the lower surface of module 105.

Note that a plurality of the above embodiments may be appropriately combined and adopted.

It should be understood that the embodiments disclosed herein are illustrative in all respects and not restrictive. The scope of the present disclosure is defined by the claims, and includes meanings equivalent to the claims and all modifications within the scope.

1: substrate, 1a: first surface, 1b: second surface, 3a, 3b: component, 3c, 3d, 3f: electronic component, 3f1: ground terminal, 4: antenna electrode, 7: ground conductor pattern, 8: solder wet layer, 9: connection terminal, 10: opening (of first sealing resin), 11: recess, 12: solder bump, 13: opening (of first shield film), 41: first metal block, 51, 51i: first conductive material, 51a, 51ia: first joint surface, 52: second conductive material, 61: first sealing resin, 62: second sealing resin, 70: shield film, 71: first shield film, 71a: part (covering slope), 71b: part (covering bottom surface), 72: second shield film, and 101, 102, 103, 104, 105: module.

The invention claimed is:

1. A module comprising:
    a substrate having a first surface;
    a first component and a second component, the first component and the second component being mounted on the first surface;
    a first conductive material mounted between the first component and the second component on the first surface;
    a first sealing resin provided on the first surface to cover the first component, the second component, and the first conductive material; and
    a first shield film covering a surface of the first sealing resin, the surface of the first sealing resin being farther from the substrate, wherein
    the first sealing resin has a recess to expose at least a part of the first conductive material,
    the first shield film extends along an inner surface of the recess and is, thereby, electrically connected to the first conductive material,
    the first shield film is disposed on an inside of the recess and is provided with an opening on an inside deepest part surface of the recess, and
    a metal bump is disposed inside the recess, and the metal bump is electrically connected to the first conductive material through the opening provided on the first shield film.

2. The module according to claim 1, wherein the first conductive material has a first joint surface having higher solder wettability than the first shield film on a surface of the first conductive material farther from the substrate, and the metal bump is a solder bump.

3. The module according to claim 2, wherein the first conductive material includes a first metal block, and the first metal block is a copper block.

4. The module according to claim 3, wherein the first surface is a mounting surface of the module.

5. The module according to claim 3, wherein
the substrate has a second surface as a surface opposite to the first surface,
the module further comprises an electronic component mounted on the second surface, and
the second surface and the electronic component are covered with a second sealing resin.

6. The module according to claim 2, wherein the first conductive material includes a first metal block, and includes a solder wet layer having higher solder wettability than a material of the first metal block, so that the first conductive material is exposed as the first joint surface.

7. The module according to claim 6, wherein the first surface is a mounting surface of the module.

8. The module according to claim 6, wherein
the substrate has a second surface as a surface opposite to the first surface,
the module further comprises an electronic component mounted on the second surface, and
the second surface and the electronic component are covered with a second sealing resin.

9. The module according to claim 2, wherein the first conductive material is an electronic component including a ground terminal, and the first joint surface is a part of the ground terminal.

10. The module according to claim 9, wherein the ground terminal is disposed across a surface of the electronic component facing the substrate and a surface facing an opposite side of the substrate.

11. The module according to claim 10, wherein the first surface is a mounting surface of the module.

12. The module according to claim 10, wherein
the substrate has a second surface as a surface opposite to the first surface,
the module further comprises an electronic component mounted on the second surface, and
the second surface and the electronic component are covered with a second sealing resin.

13. The module according to claim 9, wherein the first surface is a mounting surface of the module.

14. The module according to claim 9, wherein
the substrate has a second surface as a surface opposite to the first surface,
the module further comprises an electronic component mounted on the second surface, and
the second surface and the electronic component are covered with a second sealing resin.

15. The module according to claim 2, wherein the first surface is a mounting surface of the module.

16. The module according to claim 2, wherein
the substrate has a second surface as a surface opposite to the first surface,
the module further comprises an electronic component mounted on the second surface, and
the second surface and the electronic component are covered with a second sealing resin.

17. The module according to claim 1, wherein the first surface is a mounting surface of the module.

18. The module according to claim 17, wherein
the substrate has a second surface as a surface opposite to the first surface,
the module further comprises an electronic component mounted on the second surface, and
the second surface and the electronic component are covered with a second sealing resin.

19. The module according to claim 1, wherein
the substrate has a second surface as a surface opposite to the first surface,
the module further comprises an electronic component mounted on the second surface, and
the second surface and the electronic component are covered with a second sealing resin.

20. The module according to claim 19, further comprising:
a second conductive material mounted on the second surface,
wherein the second sealing resin has a thickness more than a height of the second conductive material,
the second sealing resin has a surface covered with a second shield film, the surface of the second sealing resin being farther from the substrate, and
the second conductive material is disposed between a plurality of electronic components mounted on the second surface and includes a second metal block.

* * * * *